United States Patent

Yamamoto et al.

(10) Patent No.: US 11,430,927 B2
(45) Date of Patent: Aug. 30, 2022

(54) SEMICONDUCTOR LIGHT-EMITTING DEVICE AND METHOD FOR MANUFACTURING THE SAME

(71) Applicant: NIKKISO CO., LTD., Tokyo (JP)

(72) Inventors: Shuichiro Yamamoto, Ishikawa (JP); Hiroyasu Ichinokura, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 0 days.

(21) Appl. No.: 16/845,158

(22) Filed: Apr. 10, 2020

(65) Prior Publication Data

US 2020/0328331 A1 Oct. 15, 2020

(30) Foreign Application Priority Data

Apr. 12, 2019 (JP) .............................. JP2019-076203

(51) Int. Cl.
*H01L 33/56* (2010.01)
*H01L 33/58* (2010.01)

(52) U.S. Cl.
CPC .............. *H01L 33/56* (2013.01); *H01L 33/58* (2013.01); *H01L 2933/005* (2013.01); *H01L 2933/0058* (2013.01)

(58) Field of Classification Search
CPC . H01L 33/56; H01L 33/58; H01L 2933/0058; H01L 2933/005
See application file for complete search history.

(56) References Cited

U.S. PATENT DOCUMENTS

| | | | | |
|---|---|---|---|---|
| 2002/0068357 A1* | 6/2002 | Mathies | ................... | B01L 7/52 435/303.1 |
| 2006/0138443 A1* | 6/2006 | Fan | ...................... | H01L 33/56 257/E33.059 |
| 2012/0012875 A1* | 1/2012 | Ooyabu | ................. | H01L 33/507 257/98 |
| 2016/0365493 A1* | 12/2016 | Su | ......................... | H01L 33/486 |
| 2018/0195677 A1* | 7/2018 | Konagayoshi | ............ | F21S 8/02 |

FOREIGN PATENT DOCUMENTS

| | | | |
|---|---|---|---|
| JP | 2015-015404 A | 1/2015 | |
| JP | 2018-14493 A | 1/2018 | |
| JP | 2019-36692 A | 3/2019 | |
| WO | 2013/088790 A1 | 6/2013 | |
| WO | WO-2017047358 A1 * | 3/2017 | ......... G02B 27/0955 |

OTHER PUBLICATIONS

Official Action dated Jun. 14, 2022 received from the Japanese Patent Office in related application JP 2019-076203 together with English language translation.

* cited by examiner

*Primary Examiner* — Jay C Chang
*Assistant Examiner* — Mikka Liu
(74) *Attorney, Agent, or Firm* — Scully, Scott, Murphy & Presser, PC

(57) ABSTRACT

A semiconductor light-emitting device includes a semiconductor light-emitting element that emits ultraviolet radiation at a wavelength of not more than 360 nm, a package substrate that houses the semiconductor light-emitting element, a thin film layer that is formed on the package substrate and has a predetermined thickness, and a sealing material made of a silicone resin which is provided on the thin film layer so as to have a lens shape and seals the semiconductor light-emitting element, in which the sealing material forms a contact angle of not less than 15° with the thin film layer.

6 Claims, 6 Drawing Sheets

SEMICONDUCTOR LIGHT-EMITTING DEVICE AND METHOD FOR MANUFACTURING THE SAME

The present application is based on Japanese Patent Application No. 2019-076203 filed on Apr. 12, 2019, the entire contents of which are incorporated herein by reference.

BACKGROUND OF THE INVENTION

1. Field of the Invention

The invention relates to a semiconductor light-emitting device and a method for manufacturing the same, in particular, to a semiconductor light-emitting device provided with a nitride semiconductor light-emitting element emitting ultraviolet radiation and a method for manufacturing the same.

2. Related Art

In recent years, a resin-sealed lighting device having a semiconductor light-emitting element sealed with a resin has been provided (see JP 2015-15404A).

The resin-sealed lighting device described in JP 2015-15404A has an LED module and a circuit board on which the LED module is fixed. The LED module is provided with a substrate, a semiconductor light-emitting element placed on the substrate, a reflector housing the semiconductor light-emitting element, a phosphor-containing resin material sealing the semiconductor light-emitting element, a lens formed on the phosphor-containing resin material, a first electrode electrically connected to the semiconductor light-emitting element and exposed to the outside from the reflector on the side opposite to the light-emitting element-arrangement side, and a second electrode facing the first electrode.

In the device described above, the lens is provided on and in contact with the upper surface of a raised portion formed on the upper surface of the reflector, and, at its edge, the shape of the lens is formed by a contact angle determined by the balance between the surface tension of the lens and the interfacial tension between the lens and the sealing resin.

In the meantime, according to JP 2015-15404A, the lens is formed of a low refractive index resin material (acrylic resin such as PMMA, silicone resin, urethane resin, or epoxy resin). Of those, silicone resin having light resistance against UV radiation is used particularly for LEDs emitting ultraviolet radiation at a wavelength of not more than 360 nm.

A solvent or a catalyst, etc., is mixed to the silicone resin to stably cure the silicone resin. These solvent and catalyst need to be vaporized at the time of curing the silicone resin at a high temperature. In case of shaping and curing by a casting method such as molding, there are possibilities that the solvent or catalyst remains and it is thus not possible to sufficiently cure the resin, or the ultraviolet radiation causes change of material properties and resulting degradation of the resin and this negatively affects reliability of the light-emitting element. These negative effects are significant particularly in LEDs emitting ultraviolet radiation at a wavelength of not more than 340 nm. The reason for this is that carbon-carbon bonds (so-called C—C bonds) are broken by ultraviolet radiation at a wavelength of not more than 340 nm and degradation of the silicone resin is thereby accelerated. Even in ultraviolet LEDs with a wavelength of 360 nm, since the emission wavelength is broad and ranges from about 335 nm to 385 nm with its peak at 360 nm, the resin is affected by the wavelength of not more than 340 nm and degradation is also accelerated. For this reason, the silicone resin for sealing ultraviolet LEDs with a wavelength of not more than 360 nm is desirably naturally shaped and cured without using a method by molding, etc., to minimize the possibility of having residual solvent or catalyst components as much as possible.

Meanwhile, the silicone resin has a low surface tension (e.g., about 20 dyne/cm) and viscosity adjustment additives are added thereto for stabilization of the shape. In case of using such a silicone resin to seal ultraviolet LEDs with a wavelength of not more than 360 nm, these additives are also affected by the ultraviolet radiation mentioned above and degradation of the silicone resin is thereby accelerated. On the other hand, when the viscosity adjustment additives are not added to the silicone resin, wettability of the reflector to the silicone resin is high and a contact angle of the silicone resin to the raised portion of the reflector is thus limited to less than a certain angle (e.g., 15°).

Even if not less than a certain amount of silicone resin is applied to increase the contact angle, there are possibilities that, e.g., the silicone resin overflows from the reflector or high wettability causes the silicon resin to trickle from the top of the reflector down along the outer side wall. In addition, even if the silicone resin is successfully applied so that the contact angle is not less than the certain angle mentioned above, it is difficult to cure the silicone resin while maintaining its shape since viscosity of the silicone resin decreases in the subsequent curing step in which the silicone resin is heated, and this causes the silicone resin to overflow from the reflector or to trickle down along the outer side wall of the reflector, as described above. On the other hand, when adding viscosity adjustment additives to maintain the shape or molding using a mold, the additives or the residual solvent or catalyst components are decomposed by ultraviolet radiation at a wavelength of not more than 360 nm and this significantly accelerates degradation of the silicone resin, resulting in a significant decrease in reliability of the element.

As described above, for ultraviolet LEDs with a wavelength of not more than 360 nm, it is difficult to simultaneously achieve formation of a lens-shaped silicone resin with a contact angle of not less than a certain angle by naturally shaping and curing the resin and ensuring of high reliability. Therefore, when reliability of the product is the priority, there is no choice but to seal with the silicone resin of a flat shape (see FIG. 4) or of a lens shape with a small curvature. As a result, it may not be possible to sufficiently prevent total reflection of light at an interface between the silicone resin and air and thus may not be possible to sufficiently obtain the light extraction efficiency improvement effect by sealing with the silicone resin.

THE SUMMARY OF THE INVENTION

Therefore, it is an object of the invention to provide an ultraviolet semiconductor light-emitting device with an emission wavelength of not more than 360 nm which can obtain the light extraction efficiency improvement effect and is highly reliable even when using a silicone resin as a sealing material, and also to provide a method for manufacturing such an ultraviolet semiconductor light-emitting device.

According to a feature of the invention, a semiconductor light-emitting device, comprises:

a semiconductor light-emitting element that emits ultraviolet radiation at a wavelength of not more than 360 nm;

a package substrate that houses the semiconductor light-emitting element;

a thin film layer that is formed on the package substrate and has a predetermined thickness; and a sealing material that comprises a silicone resin, is provided on the thin film layer so as to have a lens shape and seals the semiconductor light-emitting element, wherein the sealing material forms a contact angle of not less than 15° with the thin film layer.

Points of the Invention

According to the present invention, it is possible to provide an ultraviolet semiconductor light-emitting device with an emission wavelength of not more than 360 nm which can obtain the light extraction efficiency improvement effect and is highly reliable even when using a silicone resin as a sealing material, and also to provide a method for manufacturing such an ultraviolet semiconductor light-emitting device.

BRIEF DESCRIPTION OF THE DRAWINGS

Next, the present invention will be explained in more detail in conjunction with appended drawings, wherein.

DESCRIPTION OF THE PREFERRED EMBODIMENT

An embodiment of the invention will be described below in reference to the appended drawings. The embodiment below is described as a preferred example for implementing the invention. Although some part of the embodiment specifically illustrates various technically preferable matters, the technical scope of the invention is not limited to such specific aspects.

Embodiment

Nitride Semiconductor Ultraviolet Light-Emitting Device

Figure 1:
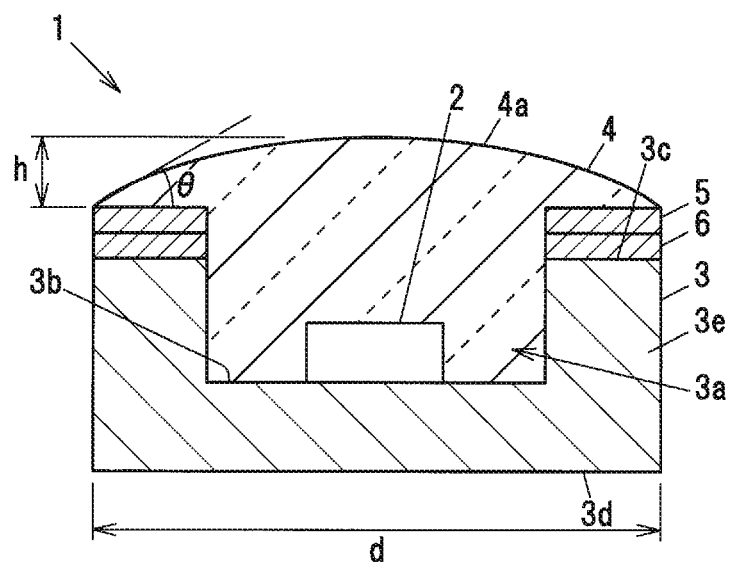
FIG. 1 is a schematic cross-sectional view showing a configuration of a nitride semiconductor ultraviolet light-emitting device in an embodiment of the present invention.

FIG. 1 is a schematic cross-sectional view showing a configuration of a nitride semiconductor ultraviolet light-emitting device in the embodiment of the invention. As shown in FIG. 1, a nitride semiconductor ultraviolet light-emitting device (hereinafter, also simply referred to as "light-emitting device") 1 in the embodiment of the invention is provided with a nitride semiconductor light-emitting element (hereinafter, also simply referred to as "light-emitting element") 2 emitting ultraviolet radiation (also called "ultraviolet light", the same applies hereinafter) at an emission wavelength of not more than 360 nm, a package substrate 3 housing the light-emitting element 2, a sealing material 4 sealing the light-emitting element 2, a thin film layer (hereinafter, also simply referred to as "thin film") 5 which is formed on the package substrate 3 at a position between the package substrate 3 and the sealing material 4 to reduce wettability to the sealing material 4 and thereby increase a contact angle θ between the package substrate 3 and the sealing material 4, and an adhesive layer 6 bonding the package substrate 3 to the thin film layer 5.

The "contact angle θ between the package substrate 3 and the sealing material 4" here means an angle formed by a virtual plane in contact with an edge portion of an upper surface 4a (i.e., a curve surface) of the sealing material 4 (see a diagonal line in FIG. 1) and a rim face 3c of the package substrate 3 (or the upper surface of the thin film layer 5 described later). The light-emitting device 1 is an example of the semiconductor light-emitting device. The light-emitting element 2 is an example of the semiconductor light-emitting element. Next, each constituent element will be described in detail.

Light-Emitting Element 2

Figure 2:
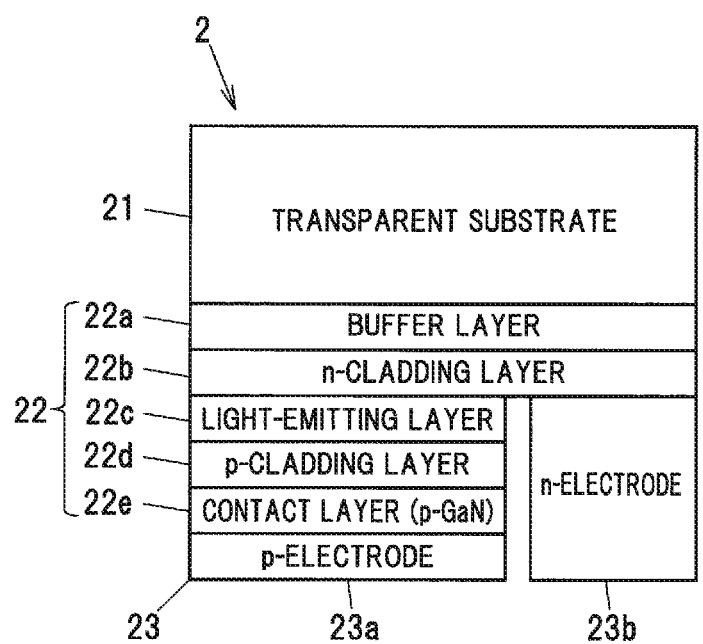
FIG. 2 is an enlarged explanatory diagram illustrating a stacked structure of a nitride semiconductor light-emitting element shown in FIG. 1.

FIG. 2 is an enlarged explanatory diagram illustrating a stacked structure of the light-emitting element 2 shown in FIG. 1. The light-emitting element 2 is, e.g., a light-emitting diode (LED) which emits ultraviolet radiation (including deep ultraviolet radiation) at a wavelength of not more than 360 nm. As shown in FIG. 2, the light-emitting element 2 has a transparent substrate 21, a nitride semiconductor layer 22 formed on the transparent substrate 21, and an electrode 23. Hereinafter, a layer formed of an AlGaN-based nitride semiconductor will be described as an example of the nitride semiconductor layer 22.

The nitride semiconductor layer 22 has a buffer layer 22a formed of AlN, an n-cladding layer 22b formed of n-type AlGaN, a light-emitting layer 22c containing AlGaN, a p-cladding layer 22d formed of p-type AlGaN, and a contact layer 22e formed of p-type GaN, which are sequentially stacked in this order from the transparent substrate 21 side. The electrode 23 has an anode-side electrode portion (p-electrode) 23a formed on the contact layer 22e, and a cathode-side electrode portion (n-electrode) 23b formed on the n-cladding layer 22b.

Ultraviolet radiation emitted by the light-emitting layer 22c passes through the transparent substrate 21 and is guided to the outside of the light-emitting element 2. Thus, it is desirable to use the transparent substrate 21 which is as transparent to the emitted ultraviolet radiation as possible. In detail, it is desirable to use the transparent substrate 21 which is not less than 70% transparent to the emitted ultraviolet radiation. A single crystal substrate of sapphire or AlN, etc., may be used as the transparent substrate 21.

Package Substrate 3

The package substrate 3 has a substantially rectangular parallelepiped shape. The package substrate 3 is constructed from, e.g., a high temperature co-fired ceramic (HTCC) multi-layered substrate or a low temperature co-fired ceramic (LTCC) multi-layered substrate. In addition, the package substrate 3 is formed using aluminum nitride (AlN) or alumina ($Al_2O_3$). Particularly when using AlN, good heat dissipation is obtained due to its high thermal conductivity, hence, high reliability.

Besides HTCC, the package substrate 3 may alternatively be formed of, e.g., a resin or a metal. In this regards, however, in the resin-sealed light-emitting element 2 sealed with a resin including silicone, etc., heat is likely to accumulate in the vicinity of an interface between a resin used as the sealing material 4 and the light-emitting element 2, and in addition to this, the resin is relatively weak against heat and thus may deteriorate. Therefore, it is desirable to use the package substrate 3 formed of a ceramic with high heat dissipation.

A recessed portion (also called "cavity") 3a is formed on the upper surface of the package substrate 3. The light-emitting element 2 is housed in the recessed portion 3a and mounted on a bottom surface 3b of the recessed portion 3a. Preferably, the light-emitting element 2 is flip-chip mounted on the bottom surface 3b of the package substrate 3, with the transparent substrate 21 located on the upper side (on the opening side of the recessed portion 3a) and the nitride semiconductor layer 22 located on the lower side (on the bottom surface 3b side of the recessed portion 3a). In addition, although it is not shown in the drawing, the electrode 23 is electrically connected, via gold bumps, etc., to a substrate electrode (not shown) provided on the package substrate 3.

Sealing Material 4

The sealing material 4 seals the light-emitting element 2. The sealing material 4 is formed of a material with a certain light resistance against ultraviolet radiation. "Light resistance" here is a measure of the degree of degradation caused by light. As an example, the sealing material 4 is formed of a resin consisting mainly of silicone (hereinafter, also simply referred to as "the silicone resin"). The sealing material 4 has a higher refractive index (e.g., about 1.10 to 1.80) than the air. In case of the silicone resin, the refractive index is roughly about 1.40.

The sealing material 4 is formed to fill the recessed portion 3a and to bulge upward of the package substrate 3. In addition, the upper surface 4a of the sealing material 4 is formed to have a shape with a smoothly curved surface (e.g., a hemispherical shape or a semi-elliptical spherical shape). In other words, the sealing material 4 is formed above the recessed portion 3a of the package substrate 3 so as to have a lens shape which is convex upward (also called "a dome shape"). This shape reduces total reflection at a boundary between the sealing material 4 and the air and thereby improves light extraction efficiency.

To reduce total reflection of light from the sealing material 4 and improve the light extraction efficiency, the sealing material 4 needs to be formed in a lens shape with not less than a certain curvature, and this requires the sealing material 4 to be formed so that the contact angle θ formed with the package substrate 3 (hereinafter, also referred to as "the contact angle θ") is not less than a certain angle. The contact angle θ is preferably not less than 15°, more preferably about 45°, and is preferably not less than 30° and not more than 80°.

In the present embodiment, θ=2 arctan (h/0.5 d) is used as a simplified method to calculate the contact angle θ, where h is a distance from an upper surface of a thin film layer 5 on the rim face 3c of the package substrate 3 to the highest point of the upper surface 4a of the sealing material 4 (hereinafter, also referred to as "the height of the sealing material 4"), and d is the entire length of a shorter side of the package substrate 3 (hereinafter, also simply referred to as "the short side"). In case that a lower surface 3d of the package substrate 3 has a substantially square shape, the short side d is any one of the sides forming the lower surface 3d of the package substrate 3.

Given that the short side d of the package substrate 3 is 3.5 mm and when the height h of the sealing material 4 is about 0.7 mm, the contact angle obtained from the above equation is about 45°. In this regard, however, the simplified method to calculate the contact angle θ by the above equation cannot be use when the package substrate 3 has a rectangular shape with an extremely high aspect ratio or when, even in case of a substantially square shape, the entire short side d is significantly longer than 3.5 mm and is, e.g., not less than 5 mm or the height of the sealing material 4 is significantly large and is, e.g., not less than 1.0 mm, since the volume of the sealing material becomes significantly large with respect to the contact area between the package substrate 3 and the sealing material and also change in shape occurs due to its mass.

In such cases, the height h of the sealing material 4 is desirably not less than 7.5%, more preferably about 20%, of the entire short side d.

In other words, it is preferable that h satisfy the following relation (1):

$$0.075 \times d(\text{mm}) \leq h \tag{1}$$

where h is the height of the sealing material 4 and d is the shorter side of the package substrate 3. Here, the contact angle θ≥15° is satisfied as long as at least h≥0.075×d (mm).

As an example, when the short side d of the package substrate 3 is 3.5 mm, a desirable value of the height h of the sealing material 4 is not less than 0.25 mm, more preferably, about 0.7 mm to 0.8 mm to improve the light extraction efficiency. In this case, the contact angle θ is about 16° when the height h of the sealing material 4 is 0.25 mm, and the contact angle θ is about 44° when the height h of the sealing material 4 is 0.70 mm.

Thin Film Layer 5

The thin film layer 5 is a layer or thin film which has a function of increasing the contact angle θ by reducing wettability of the rim face 3c of the package substrate 3 to the sealing material 4 formed of a silicone resin, i.e., by facilitating repelling of the sealing material 4 on the rim face 3c of the package substrate 3. Wettability of the thin film layer 5 to the silicone resin constituting the sealing material 4 is smaller than wettability of the package substrate 3 to the silicone resin. The thin film layer 5 does not necessarily need to have complete liquid repellency.

As shown in FIG. 1, the thin film layer 5 is formed above the rim face 3c of the package substrate 3 at a portion in contact with the silicone resin.

Since this configuration allows the contact angle θ to be increased, the sealing material 4 formed of the silicone resin is easily shaped into a lens shape with a large curvature (e.g., a shape with the contact angle θ of not less than 15°) by naturally shaping and curing the resin.

The thin film layer 5 has a predetermined thickness. In detail, the thin film layer 5 has a thickness of, e.g., not less than 0.25 μm, preferably, not less than 1.0 μm.

This is because an effect of repelling the silicone resin may be less likely to be obtained when the thin film layer 5 is thinner than 0.25 μm. The thickness of the thin film layer 5 may be limited to a certain thickness (about 0.5 to 1.5 μm) to suppress an increase in cost. It should be noted that the thin film layer 5 in FIG. 1 is depicted thicker than the actual thickness for convenience of explanation.

The thin film layer 5 may be formed across the entire rim face 3c of the package substrate 3, from the outer side to the inner side. In other words, the thin film layer 5 may be formed in the whole area in the thickness direction of a rim portion 3e of the package substrate 3 (in the horizontal direction in FIG. 1). However, when it is difficult to form the thin film layer 5 in the whole area in the thickness direction of the rim portion 3e of the package substrate 3 due to constraints in the manufacturing process, etc., the thin film layer 5 may be absent on a portion on the outer side, on the inner side, or on the both sides of the rim face 3c of the package substrate 3.

The thin film layer 5 may be formed of a stable metal with a low surface energy so as to have the above-mentioned function (i.e., the function of facilitating repelling of the sealing material 4). The thin film layer 5 may preferably be a metal layer or a metal film which is formed of one metal such as gold (Au), silver (Ag), platinum (Pt), palladium (Pd) or rhodium (Rh), or an alloy consisting of two or more of these metals.

When the sealing material 4 is directly formed on the rim face 3c of the package substrate 3 without forming the thin film layer 5, it is difficult to form the sealing material 4 having a shape with the contact angle θ of not less than 15°. The reason for this is that problems due to high wettability of the package substrate 3 to the sealing material 4 occur, such that the sealing material 4 trickles down along the outer wall during application or curing of the sealing material 4 and it is thus difficult to maintain the shape of the sealing material 4.

Adhesive Layer 6

The adhesive layer 6 bonds the rim face 3c of the package substrate 3 to the lower surface of the thin film layer 5. The adhesive layer 6 may be, e.g., a metal layer of nickel (Ni) or chromium (Cr), etc., and may further have a metal layer of tungsten (W), etc., between the metal layer of nickel (Ni) or chromium (Cr), etc. and the rim face 3c of the package substrate 3.

That is, the adhesive layer 6 is formed to include nickel (Ni) or chromium (Cr) and tungsten (W), and may have a double-layer structure of tungsten (W) and nickel (Ni), or tungsten (W) and chromium (Cr), from the rim face 3c side of the package substrate 3, or may be a single layer including an alloy of such metals.

Tungsten (W) has an effect of improving wettability of the package substrate 3 by metal, and nickel (Ni) and chromium (Cr) have an effect of improving adhesion of the thin film layer 5.

To improve adhesion of the thin film layer 5, a double-layer structure of tungsten (W) and nickel (Ni), or tungsten (W) and chromium (Cr), is desirable. Alternatively, a single film or a stacked film of an alloy layer(s) including two or more of these three metals may be provided.

The thickness of the adhesive layer 6 is preferably not less than 0.25 μm, more preferably, not less than 1.0 μm to obtain the effect of improving adhesion. Particularly when the package substrate material is a ceramic, the adhesive layer 6 may be integrated with the ceramic at the surface in contact with the rim face 3c of the package substrate 3.

The adhesive layer 6 may be formed across the entire rim face 3c of the package substrate 3 from the outer side to the inner side, but when it is difficult to form in the whole area in the thickness direction of the rim portion 3e of the package substrate 3 due to constraints in the manufacturing process, etc., the adhesive layer 6 may be absent on a portion on the outer side, on the inner side, or on the both sides of the rim face 3c of the package substrate 3, in the same manner as the thin film layer 5.

Method for Manufacturing Light-Emitting Device 1 in the Present Embodiment

Figure 3:
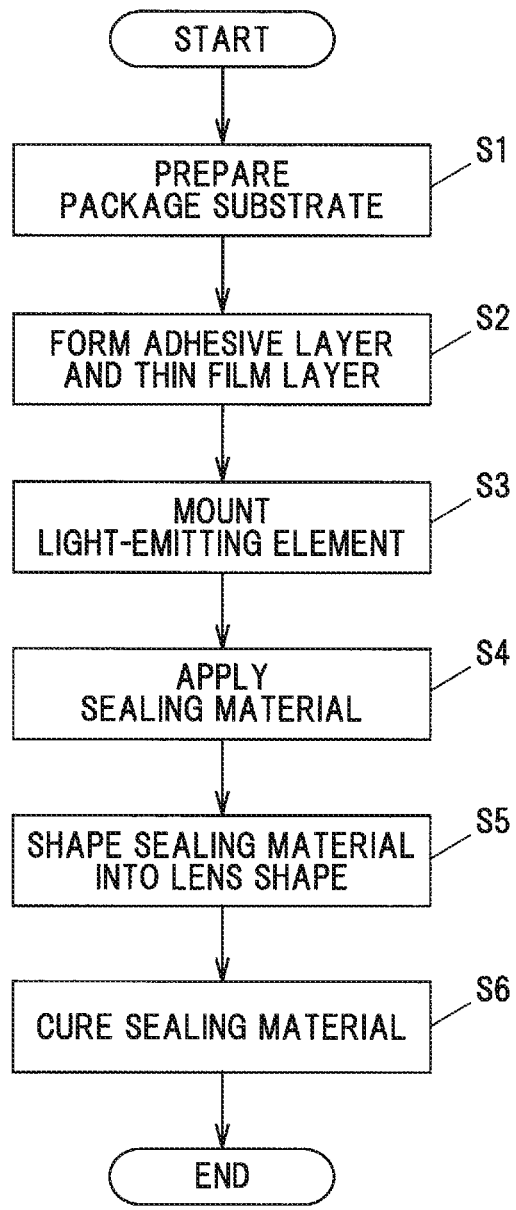
FIG. 3 is a flowchart showing an example of a method for manufacturing the nitride semiconductor ultraviolet light-emitting device in the embodiment of the invention.

Next, a method for manufacturing the light-emitting device 1 in the embodiment of the invention will be described. FIG. 3 is a flowchart showing an example of the method for manufacturing the light-emitting device 1 in the embodiment of the invention.

As shown in FIG. 3, the method for manufacturing the light-emitting device 1 in the embodiment of the invention includes a step of preparing the package substrate 3 (S1), a step of forming the adhesive layer 6 and the thin film layer 5, which are formed of metals, on the package substrate 3, in particular, on the rim face 3c of the package substrate 3 (S2), a step of placing the light-emitting element 2 so as to be housed in the package substrate 3, i.e., a step of mounting the light-emitting element 2 on the bottom surface 3b of the recessed portion 3a of the package substrate 3 (S3), a step of applying the sealing material 4 formed of a silicone resin onto the package substrate 3 mounting the light-emitting element 2 so that the recessed portion 3a of the package substrate 3 is filled with the sealing material 4 (S4), a step of shaping a bulging portion above the package substrate 3 into a lens shape (S5), and a step of curing the lens-shaped sealing material 4 (S6).

The step of forming the adhesive layer 6 and the thin film layer 5 in Step S2 includes a step of forming a mask on the rim face 3c of the package substrate 3 and a step of depositing metals in an exposed region of the rim face 3c in which the mask is not formed. Through these steps, the adhesive layer 6 and the thin film layer 5 are deposited in a pattern of the mask in Step S2. The adhesive layer 6 and the thin film layer 5 are preferably formed to have a substantially uniform thickness from the rim face 3c. The adhesive layer 6 and the thin film layer 5 may be simultaneously formed by a single deposition process, or the adhesive layer 6 and the thin film layer 5 may be respectively formed by several deposition processes.

The adhesive layer 6 and the thin film layer 5 are preferably formed on the entire rim face 3c but may be absent on a portion on the outer side, on the inner side, or on the both sides of the rim face 3c, depending on the step of forming the mask used for forming the adhesive layer 6 and the thin film layer 5. However, when the thin film layer 5 is a single film formed of one metal selected from gold (Au), silver (Ag), platinum (Pt), palladium (Pd) and rhodium (Rh) or is a single film of an alloy consisting of two or more of these metals, the adhesive layer 6 is preferably formed thereunder.

The step of shaping the sealing material 4 into a lens shape in Step S5 includes a step of shaping so that the contact angle θ is not less than 15°, preferably, about 45°.

The step of curing the sealing material 4 in Step S6 includes, e.g., a step of heating the sealing material 4 at a curing temperature at which the silicone resin cures (in particular, from 150 degrees C. to 200 degrees C.). At this time, the curing temperature does not cause a significant change in wettability when the thin film layer 5 is formed of the metals mentioned above. Therefore, it is possible to cure the sealing material 4 while maintaining the shape and the contact angle θ of the sealing material 4 shaped in Step S5.

However, there is a limit to liquid repellency of the thin film layer 5 and the resin is likely to overflow during curing since viscosity of the sealing material 4 decreases due to heat. For this reason, when the contact angle was about 60°, it was difficult to maintain the shape of the sealing material 4 in the step of applying or curing the resin and devices with the resin overflowing from the package began to appear, and when the contact angle was about 80°, the resin overflowed from the package in substantially all devices during the application step or the curing step. Based on this, from the point of view of production yield, the design value is set to a contact angle of about 45° at which probability of overflow of the resin in the steps of applying and curing the resin is very low and light extraction efficiency is relatively high.

Examples

Figure 4:
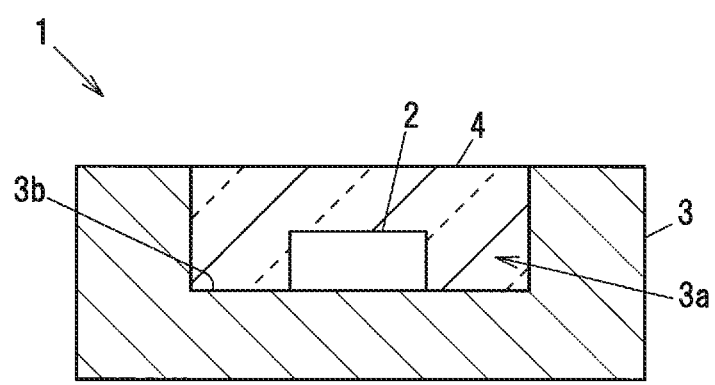
FIG. 4 is a schematic cross-sectional view showing a configuration of a nitride semiconductor ultraviolet light-emitting device in Comparative Example.

The light-emitting devices 1 described above were made using the light-emitting element 2 having an emission wavelength 310 nm and a light output of about 60 mW at a current of 350 mA. Meanwhile, a light-emitting device having the sealing material 4 with the flat upper surface 4a as shown in FIG. 4 was prepared as Comparative Example. In the present Examples, the thin film layer 5 was formed of 1 μm-thick gold (Au), and the adhesive layer 6 bonding the rim face 3c of the package substrate 3 to the lower surface of the thin film layer 5 was formed of tungsten (W) (thickness not specified) formed on the rim face 3c of the package substrate 3 and 1 μm-thick nickel (Ni) further formed thereon to improve adhesion of the thin film layer 5.

Light output of about 75 mW was obtained from the light-emitting device 1 with the contact angle θ of about 15° (hereinafter, also referred to as "Example 1"). That is, in Example 1, light output was improved about 1.25 times. Meanwhile, light output of about 100 mW was obtained from the light-emitting device 1 in which the short side d of the package substrate 3 was 3.5 mm and the height h of the sealing material 4 was 0.75 mm (hereinafter, also referred to as "Example 2"). That is, in Example 2, light output was improved about 1.7 times.

On the other hand, in Comparative Example shown in FIG. 4, light output was about 55 mW, which is about 10% of decrease. It is considered that, in Examples 1 and 2, light extraction efficiency was improved as a result of reducing light components totally reflected at the interface between the sealing material 4 and the air, hence, light output was improved.

Figure 5:
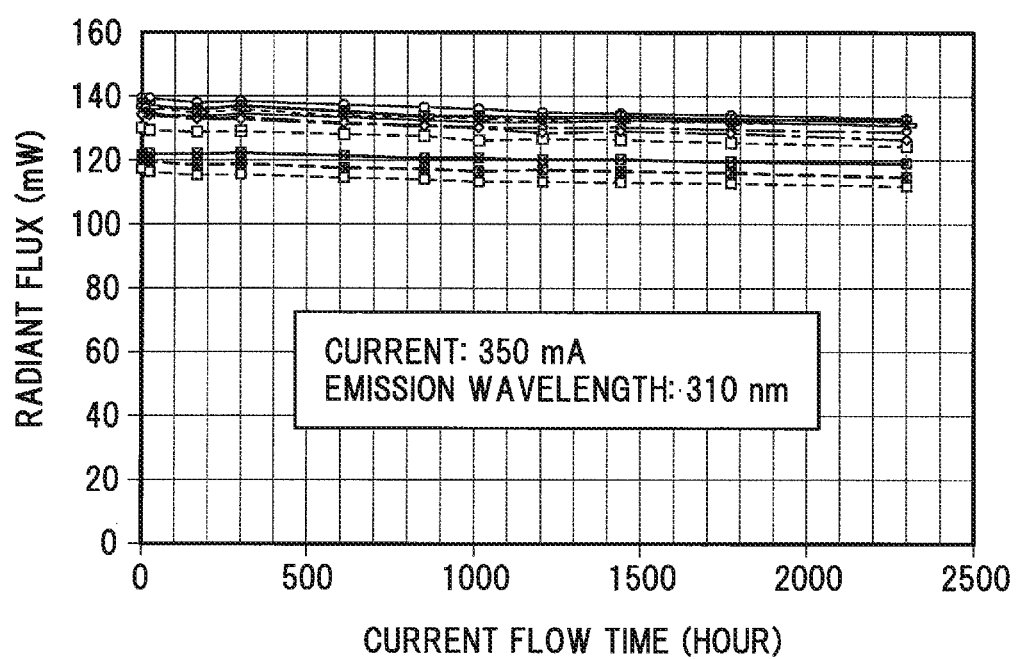
FIG. 5 is a diagram illustrating an example of the result of a long-term driving test conducted on the nitride semiconductor ultraviolet light-emitting devices in the embodiment of the invention.

The present inventors conducted a long-term driving test at a current value of 350 mA using the light-emitting devices 1 with an emission wavelength of 310 nm and having the sealing material 4 with the height h of 0.75 mm in Example 2. FIG. 5 is a diagram illustrating an example of the result of a long-term driving test conducted on the light-emitting devices 1 in Example 2. In FIG. 5, the horizontal axis indicates current flow time (hour) and the vertical axis indicates radiant flux (mW). Ten samples were prepared. The emission wavelength was 310 nm and the current was at 350 mA. As shown in FIG. 5, the attenuation rate of the radiant flux when the current flow time of 2000 hours elapsed was under 5% in all samples. This result confirmed that the light-emitting device 1 in Example 2 has reliability at a level of not less than 2000 hours.

Modification

Figure 6:
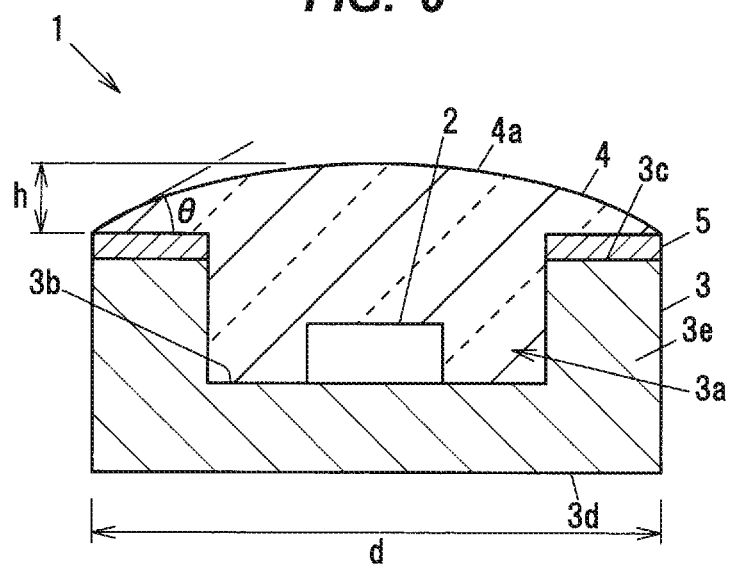
FIG. 6 is a schematic cross-sectional view showing a configuration of a nitride semiconductor ultraviolet light-emitting device in a modification of the invention.

FIG. 6 is a schematic cross-sectional view showing a configuration of the light-emitting device 1 in a modification of the invention. As shown in FIG. 6, the light-emitting device 1 may not necessarily have the adhesive layer 6. In this case, the thin film layer 5 may be, e.g., a single layer of an alloy including one or more metals selected from tungsten (W), nickel (Ni) and chromium (Cr) as well as one or more metals selected from gold (Au), silver (Ag), platinum (Pt), palladium (Pd) and rhodium (Rh), or a single layer formed of any one metal selected from gold (Au), silver (Ag), platinum (Pt), palladium (Pd) and rhodium (Rh), or a single layer of a metal alloy including one or more of these metals.

The configuration is not limited to the double-layer structure having the adhesive layer 6 and the thin film layer 5 as separate layers, and may be a single-layer structure in which the adhesive layer 6 and the thin film layer 5 are integrated.

Functions and Effects of the Embodiment

In the embodiment and modification of the invention, by forming the thin film layer 5 on the package substrate 3 and then forming the sealing material 4 on the thin film layer 5, it is possible to form the sealing material 4 which forms a contact angle of not less than 15° with the thin film layer. As a result, even when the sealing material 4 is formed of a silicone resin, the sealing material 4 can be formed in a lens shape with not less than a certain curvature by a method using the natural shape, and it is thus possible to prevent total reflection of light at the interface between the sealing material 4 and the air and thereby obtain the light extraction efficiency improvement effect.

In addition, in the embodiment, addition of additives to increase viscosity of the silicone resin to maintain the shape is not required. Therefore, it is possible to reduce the possibility of influence on reliability of the light-emitting element 2, such as deterioration of the light-emitting element 2 due to degradation or decomposition of the additives caused by ultraviolet energy in the ultraviolet region of not more than 360 nm.

In addition, in the embodiment, since the light-emitting device 1 can be formed by naturally shaping and curing the resin without using a mold, there is no residual solvent or catalyst components. As a result, even when an LED with an emission wavelength of not more than 360 nm is sealed with a silicone resin, it is possible to provide a highly reliable semiconductor light-emitting device with high light extraction efficiency.

Summary of the Embodiment

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A semiconductor light-emitting device (1), comprising: a semiconductor light-emitting element (2) that emits ultraviolet radiation at a wavelength of not more than 360 nm; a package substrate (3) that houses the semiconductor light-emitting element (2); a thin film layer (5) that is formed on the package substrate (3) and has a predetermined thickness; and a sealing material (4) that comprises a silicone resin, is provided on the thin film layer (5) so as to have a lens shape and seals the semiconductor light-emitting element (2), wherein the sealing material (4) forms a contact angle of not less than 15° with the thin film layer (5).

[2] The semiconductor light-emitting device (1) described in [1], wherein wettability of the thin film layer (5) to the silicone resin is smaller than wettability of the package substrate (3) to the silicone resin.

[3] The semiconductor light-emitting device (1) described in [2], wherein the thin film layer (5) comprises a metal layer formed of metal comprising at least one of gold (Au), silver (Ag), platinum (Pt), palladium (Pd) and rhodium (Rh).

[4] The semiconductor light-emitting device (1) described in any one of [1] to [3], wherein an adhesive layer (6) for bonding the package substrate (3) to the thin film layer (5) is further provided between the package substrate (3) and the thin film layer (5).

[5] The semiconductor light-emitting device (1) described in [4], wherein the adhesive layer (6) comprises at least one of nickel (Ni), chromium (Cr) and tungsten (W).

[6] The semiconductor light-emitting device (1) described in any one of [1] to [5], wherein the contact angle is not less than 30° and not more than 80°.

[7] A method for manufacturing a semiconductor light-emitting device (1), comprising: forming a thin film layer (5) with a predetermined thickness on a package substrate (3); placing a semiconductor light-emitting element (2) so as to be housed in the package substrate (3); applying a sealing material (4) onto the package substrate (3), the sealing material (4) comprising a silicone resin and sealing the semiconductor light-emitting element (2); shaping the applied sealing material (4) into a lens shape so as to form a contact angle of not less than 15° with the thin film layer (5); and curing the sealing material (4) having the lens shape.

Although the embodiment of the invention has been described, the invention according to claims is not to be limited to the embodiment described above. Further, please note that all combinations of the features described in the embodiment are not necessary to solve the problem of the invention. In addition, the invention can be appropriately modified and implemented without departing from the gist thereof.

For example, the thin film layer 5 may not necessarily need to be a metal layer. The thin film layer 5 may be, e.g., a layer treated to repel the silicone resin (e.g., a layer with a fluorine coating). In this case, however, the coating may degrade due to heat for curing the sealing material 4 formed of the silicone resin (in particular, at a temperature from 150 degrees to 200 degrees) or the sealing material 4 may separate from the surface with the coating. Therefore, it is preferable to use a metal layer from the point of view of being thermally more stable than the coated layer.

What is claimed is:

1. A semiconductor light-emitting device, comprising:
   a semiconductor light-emitting element that emits ultraviolet radiation at a wavelength of not more than 360 nm;
   a package substrate that houses the semiconductor light-emitting element;
   a thin film layer that is formed on the package substrate and has a predetermined thickness;
   an adhesive layer for bonding the package substrate to the thin film layer is provided between the package substrate and the thin film layer; and
   a sealing material that comprises a silicone resin, is provided on the thin film layer so as to have a lens shape that seals the semiconductor light-emitting element such that the semiconductor light-emitting element is embedded in the sealing material,
   wherein the sealing material forms a contact angle of not less than 15° with the thin film layer.

2. The semiconductor light-emitting device according to claim 1, wherein wettability of the thin film layer to the silicone resin is smaller than wettability of the package substrate to the silicone resin.

3. The semiconductor light-emitting device according to claim 2, wherein the thin film layer comprises a metal layer formed of metal comprising at least one of gold (Au), silver (Ag), platinum (Pt), palladium (Pd) and rhodium (Rh).

4. The semiconductor light-emitting device according to claim 1, wherein the adhesive layer comprises at least one of nickel (Ni), chromium (Cr) and tungsten (W).

5. The semiconductor light-emitting device according to claim 1, wherein the contact angle is not less than 30° and not more than 80°.

6. A method for manufacturing a semiconductor light-emitting device, comprising:
   forming a thin film layer with a predetermined thickness on a package substrate;
   placing a semiconductor light-emitting element that emits ultraviolet radiation at a wavelength of not more than 360 nm so as to be housed in the package substrate;
   providing an adhesive layer between the package substrate and the thin film layer for bonding the package substrate to the thin film layer;
   applying a sealing material onto the thin film layer so as to embed the semiconductor light-emitting element in the sealing material, the sealing material comprising a silicone resin that seals the semiconductor light-emitting element;
   shaping the applied sealing material into a lens shape so as to form a contact angle of not less than 15° with the thin film layer; and
   curing the sealing material having the lens shape.

* * * * *